United States Patent
Chang et al.

(10) Patent No.: US 6,887,793 B2
(45) Date of Patent: May 3, 2005

(54) METHOD FOR PLASMA ETCHING A WAFER AFTER BACKSIDE GRINDING

(75) Inventors: Feng-Ru Chang, Tainan (TW); Gau-Ming Lu, Taipei (TW); Yeong-Rong Chang, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 86 days.

(21) Appl. No.: 10/157,683

(22) Filed: May 29, 2002

(65) Prior Publication Data

US 2003/0224583 A1 Dec. 4, 2003

(51) Int. Cl.⁷ ............................................. H01L 21/302
(52) U.S. Cl. ..................... 438/706; 438/691; 438/692; 438/710; 438/745
(58) Field of Search ................... 438/691, 692, 438/693, 690, 706, 710, 712, 745; 134/1.1, 1.2, 2

(56) References Cited

U.S. PATENT DOCUMENTS

| | | | | |
|---|---|---|---|---|
| 5,278,102 A | * | 1/1994 | Horie ........................ | 438/164 |
| 5,780,311 A | * | 7/1998 | Beasom et al. ............. | 438/406 |
| 6,231,775 B1 | * | 5/2001 | Levenson et al. ............. | 216/67 |
| 6,537,926 B1 | * | 3/2003 | Schrems et al. ............ | 438/770 |

* cited by examiner

Primary Examiner—Lan Vinh
(74) Attorney, Agent, or Firm—Tung & Associates

(57) ABSTRACT

A method for plasma etching a wafer after a backside grinding process which incorporates an oxidation pretreatment step is disclosed. The method includes the step of first grinding a backside of a wafer to expose a bare silicon surface. The bare silicon surface is then oxidized in an oxidation chamber to form a substantially uniform silicon oxide layer of at least 50 Å thick, and preferably at least 100 Å thick. The wafer is then positioned in a plasma etch chamber with an active surface of the wafer exposed, and a surface layer etched away by an oxygen plasma without causing any further silicon oxide formation on the backside of the wafer. The present invention novel plasma etching method can be advantageously used for removing an organic material layer, such as a photoresist layer from a wafer surface.

20 Claims, 1 Drawing Sheet

US 6,887,793 B2

METHOD FOR PLASMA ETCHING A WAFER AFTER BACKSIDE GRINDING

FIELD OF THE INVENTION

The present invention generally relates to a method for plasma etching a wafer surface for removing an unwanted coating layer and more particularly, relates to a method for plasma etching a photoresist layer from a wafer surface after a backside grinding of the wafer is performed without the non-uniform oxide layer formation defects.

BACKGROUND OF THE INVENTION

In the fabrication of semiconductor devices, various processing steps are started with a photolithographic process to first define a circuit on the wafer. For instance, in a modern memory device, multiple layers of metal conductors are required for providing a multi-layer metal interconnect structure. As the number of layers of metal interconnects increase, while the device geometry continuously decreases to allow more densely packed circuits, the photolithographic process required to define patterns of circuits becomes more complicated and difficult to carry out.

After a process for forming metal vias or lines in an insulating layer is completed, a photoresist layer must be stripped. As a result, it is necessary to subject the wafer to a wet etching process for removing the photoresist layer. For instance, a wet stripping process can be implemented after a photoresist dry stripping process by utilizing a wet etchant such as ACT® 690C or EKC® 265 in order to remove the photoresist layers. The ACT® 690C is a mixture of DMSO (dimethyl-sulphur-oxide), MEA (mono-ethyl-amine) and catechol, while EKC® 265 is a mixture containing HDA (hydroxy-amine). The conventional wet dip process requires a special buffer solvent treatment step in order to avoid or minimize metal corrosion problems in the circuits already formed on the wafer surface.

Wet etching is the more frequently used technique for stripping photoresist films from silicon wafers where the complete removal of resist images without adversely affecting the wafer surface is desired. The resist layer or images should be completely removed without leaving any residues, including contaminant particles that may have been present in the resist. The underlying surface of the photoresist layer should not be adversely affected, for instance, accidental etching of the metal or oxide surface should be avoided. Liquid etchant strippers should produce a reasonable yield in order to prevent redeposition of dissolved resist on the wafers. The etchant should completely dissolve the photoresist layer in a chemical reaction, and not just lifting or peeling so as to prevent redeposition. It is also desirable that the etching or stripping time be reasonably short in order to permit high wafer throughput.

Other wet etchants such as sulfuric acid ($H_2SO_4$) and mixture of $H_2SO_4$ with other oxidizing agents such as hydrogen peroxide ($H_2O_2$) may also be used in stripping photoresist or in cleaning a wafer surface after the photoresist has been stripped by other means. For instance, a mixture may be seven parts $H_2SO_4$ to three parts 30% $H_2O_2$, or a mixture of 88% sulfuric acid and 12% nitric acid. Wafers to be stripped can be immersed in the mixture at a temperature between about 100° C. and about 150° C. for 5~10 minutes and then subjected to a thorough rinse of deionized water and dried in dry nitrogen. This type of inorganic resist strippers, such as the sulfuric acid mixtures, is very effective in the residual-free removal of highly post-baked resist. They are more effective than organic strippers and the longer the immersion time, a cleaner and more residue-free wafer surface can be obtained.

The photoresist dry stripping process is normally carried out by a plasma etching or sometime known as a "plasma ashing" process which is effective in ashing organic photoresist layers. The plasma ashing process is an isotropic etch process for organic photoresist in an oxygen glow discharge where atomic oxygen is produced. Oxygen atoms react with organic photoresist material to form volatile products such as $CO_1$ $CO_2$ and $H_2O$. A barrel-type reactor is frequently used for the plasma ashing processing. For instance, a batch of wafers such as 25 wafers coated with 1 μm photoresist layer can be processed in less than 10 min.

When the plasma ashing method is used to remove photoresist layers on a wafer surface, the wafer is frequently ground on the backside and therefore, a bare silicon surface is exposed when the wafer is loaded into the plasma etch chamber. During the oxygen plasma ashing process, not only the top side of the wafer is etched, the peripheral edge of the backside of the wafer is also attacked by the oxygen plasma. As a result, a sawtooth shaped pattern of silicon oxide is formed along the peripheral edge of the wafer on the backside. This is shown in FIG. 1. For wafer 30, a sawtooth shaped peripheral area 32 where the bare silicon exposed by the backside grinding process is oxidized by the oxygen plasma forming silicon oxide. The surface oxidation of the bare silicon is mainly caused by oxygen plasma that flows into the shallow trench lines 34 that are provided on the surface of the heater plate in the plasma etcher for holding the wafer. At near the three ejector pin holes 36, the oxygen plasma also tend to leak in and cause oxidation of the bare silicon surface near the holes. The silicon oxide layer formed along the peripheral edge of the wafer backside makes the backside surface uneven and furthermore, the thickness of the wafer uneven. Such uneven thickness of the wafer may cause additional stress problems. When another backside grinding process is attempted to even out the backside surface, the wafer may break during the grinding process and cause a catastrophic loss.

It is therefore an object of the present invention to provide a method for plasma etching a wafer after a backside grinding process that does not have the drawbacks or shortcomings of the conventional plasma etching method.

It is another object of the present invention to provide a method for plasma etching a wafer after a backside grinding process exposing a bare silicon surface that does not oxidize the backside of the wafer.

It is a further object of the present invention to provide a method for plasma etching a wafer after a backside grinding process that does not cause the formation of silicon oxide on the backside of the wafer.

It is another further object of the present invention to provide a method for plasma etching a wafer after a backside grinding process by first oxidizing the wafer before the plasma etching process is carried out.

It is still another object of the present invention to provide a method for plasma etching a wafer after a backside grinding process by first placing the wafer in an oxidation furnace for growing a uniform layer of silicon oxide on the backside of the wafer prior to the plasma etching process.

It is yet another object of the present invention to provide a method for plasma etching a wafer after a backside grinding process by first growing a silicon oxide layer that is at least 50 Å thick on the backside of the wafer.

It is still another further object of the present invention to provide a method for plasma etching a photoresist layer on a wafer after a backside grinding process is conducted wherein the oxygen plasma does not form a silicon oxide layer on the backside of the wafer.

SUMMARY OF THE INVENTION

In accordance with the present invention, a method for plasma etching a wafer after a backside grinding process without forming uneven silicon oxide layer on the backside along a peripheral edge is disclosed.

In a preferred embodiment, a method for plasma etching a wafer after a backside grinding process which incorporates an oxidation pre-treatment step can be carried out by first grinding a backside of the wafer exposing a bare silicon surface; oxidizing the bare silicon surface forming a silicon oxide layer of at least 50 Å thick in an oxidation chamber; positioning the wafer in a plasma etch chamber with an active surface of the wafer exposed; and plasma etching away a surface layer from the active surface of the wafer.

The method for plasma etching a wafer after backside grinding may further include the step of wet stripping a residual surface layer away from the active surface of the wafer, or the step of wet stripping a residual surface layer away by exposing the active surface of the wafer to a diluted acid solution. The method may further include the step of grinding the backside of the wafer in a backside lapping process. The method may further include the step of oxidizing the bare silicon surface in an oxidation furnace, or the step of oxidizing the bare silicon surface in an oxidation furnace for a time period between about 30 min. and about 100 min. The method may further include the step of plasma etching away a surface layer by exposing the wafer to an oxygen plasma, or the step of plasma etching away a photoresist coating layer by oxygen plasma in a plasma ashing process. The method may further include the steps of plasma etching away a photoresist coating layer by an oxygen plasma and wet stripping any residual photoresist coating layer from the wafer. The method may further include the step of plasma etching away an organic material layer by an oxygen plasma in a plasma etching process.

The present invention is further directed to a method for preventing wafer backside non-uniform oxidation during a plasma ashing process for removing a photoresist layer which can be carried out by the steps of grinding a backside of a wafer exposing a bare silicon surface; oxidizing the bare silicon surface forming a silicon oxide layer of at least 50 Å thick in an oxidation chamber; positioning the wafer in a plasma etch chamber with an active surface of the wafer exposed; plasma etching away the photoresist layer on the active surface of the wafer; and wet stripping away any residual photoresist layer by a wet bench process.

The method for preventing wafer backside non-uniform oxidation during a plasma ashing process for removing a photoresist layer may further include the step of stripping the residual photoresist layer away by a wet bench process that utilizes a diluted acid stripper, or the step of oxidizing the bare silicon surface until a $SiO_2$ layer that has a thickness between about 50 Å and about 200 Å is formed. The method may further include the step of oxidizing the bare silicon surface for a time period between about 30 min. and about 100 min., or the step of plasma etching away the photoresist layer by an oxygen plasma, or the step of plasma etching away a photoresist layer formed of a polymeric material, or the step of plasma etching away a photoresist layer formed of an organic material, or the step of plasma etching away a photoresist layer formed of polyimide. The method may further include the step of plasma etching away a photoresist layer at an etch rate of at least 50,000 Å/min. The method may further include the step of plasma etching away a photoresist layer for a time period of at least 30 sec. at an etch rate of at least 50,000 Å/min.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for plasma etching a wafer after a backside grinding process is conducted that incorporates an oxidation pre-treatment step such that non-uniform formation of silicon oxide on the backside from the bare silicon can be avoided.

In the present invention novel method, a backside of a wafer is first ground to expose a bare silicon surface. The bare silicon surface is then oxidized to form a silicon oxide layer of at least 50 Å thick in an oxidation chamber. The wafer is then positioned in a plasma etch chamber with an active surface of the wafer exposed such that a surface layer can be plasma etched away from the active surface of the wafer. Optionally, the present invention method further includes the step of wet stripping in a wet bench process a residual surface layer away from the active surface of the wafer.

The oxidation step for oxidizing the bare silicon surface on the wafer backside can be carried out in an oxidation furnace for a time period between about 30 min. and about 100 min., such that a silicon oxide layer of at least 50 Å thick can be uniformly formed on the wafer backside surface.

The present invention further discloses a method for preventing wafer backside non-uniform oxidation during a plasma ashing process for removing a photoresist layer which can be carried out by first grinding a backside of a wafer to expose a bare silicon surface; then oxidizing the bare silicon surface to form a silicon oxide layer of at least 50 Å thick in an oxidation chamber; then positioning the wafer in a plasma etch chamber with an active surface of the wafer exposed; then plasma etching away the photoresist layer on the active surface of the wafer; and wet stripping away any residual photoresist layer by a wet bench process.

Figure 2:
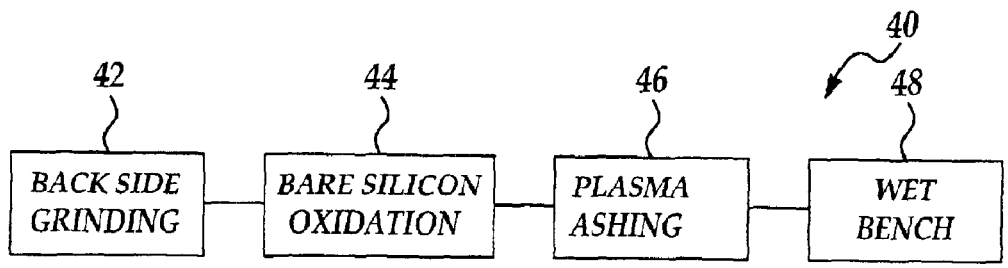
FIG. 2 is a process flow chart of the present invention method.

Referring now to FIG. 2, wherein a process flow chart 40 of the present invention method for plasma etching a wafer after a backside grinding process incorporating an oxidation pre-treatment is shown. It is seen that in the first step 42 of the process, a backside of a wafer is ground to expose a bare silicon surface. The wafer with the bare silicon surface on the backside is then oxidized in an oxidation furnace for a suitable time period, i.e. for a time period between about 30 min. and about 100 min., such that a silicon oxide layer of at least 50 Å thick, or preferably at least 100 Å thick is formed. The formation of the substantially uniform layer of silicon oxide in step 44 from the bare silicon surface substantially prevents any further silicon oxide growth when the wafer is later subjected to oxygen plasma in the plasma ashing step 46 shown in FIG. 2.

Figure 1:
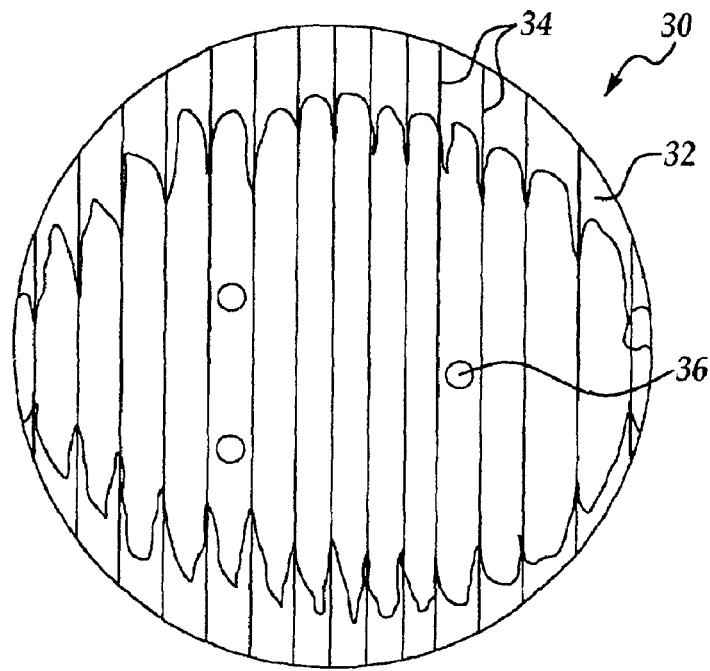
FIG. 1 is a plane view of a backside of a wafer after a conventional plasma etching process is conducted on bare silicon exposed by a backside grinding process.

The plasma ashing step can be carried out with an oxygen plasma to etch away a front side, i.e. an active side of the wafer to remove a surface layer, such as a photoresist layer or any other organic material layer. When the oxygen plasma is utilized, a desirable etch rate of about 65,000 Å/min. can be realized. For a photoresist layer of normal thickness, a total plasma etching time required is between about 30 sec. and about 60 sec. The word "about" used in this writing indicates a range of values that are ±10% of the average value given. It should be emphasized that the formation of the thin layer of silicon oxide uniformly on the backside of the wafer, i.e. in step 44, substantially prevents the further growth or formation of silicon oxide and particularly the formation of non-uniform thickness of silicon oxide on the backside of the wafer during the plasma ashing step 46. The defect of saw-tooth patterned formation of silicon oxide, shown in FIG. 1, on a bare silicon surface along a peripheral edge of the wafer backside can therefore be avoided.

After the completion of the plasma ashing step 46, the wafer can be further cleaned to complete the photoresist removal process in a wet bench process 48.

Figure 3:
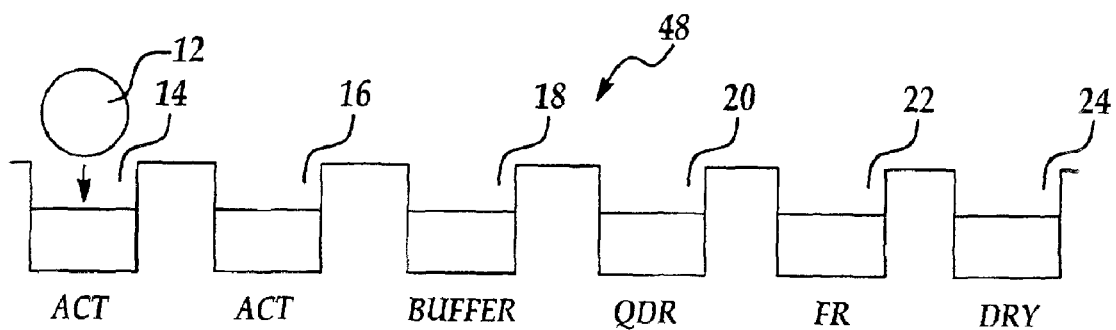
FIG. 3 is a process flow diagram of the present invention wet bench process after the plasma ashing step is carried out.

The wet bench step 48 can be shown in a process flow diagram in FIG. 3. A wafer 12 after the plasma ashing process for removing most of the photoresist layer is first dipped into an etch tank containing ACT® etch solution in bath 14 for conducting a first etch reaction. The composition of ACT® is a mixture of dimethyl-sulphur-oxide, monoethyl-amine and catechol. The ACT® solution is normally maintained at a temperature higher than room temperature, for instance, at a temperature of at least 60° C. After a suitable time period of immersing in the first bath 14, the wafer 12 is removed to the second ACT® bath 16 and again immersed for a suitable length of time. The wafer 12 is then immersed in a buffer solvent bath 18 to substantially neutralize the residual acid solution on the wafer surface. The buffer solvent bath 18 may contain a solvent such as isopropyl alcohol or an NMP. The wafer 12 is immersed in the buffer solvent for a sufficient length of time so as to neutralize all residual acid on the wafer surface, for instance, a sufficient length of time is at least 10 min. The wafer 12 is then moved to a quick dump rinse tank 20 for a rinse operation by deionized water, which is then followed by a final rinse step carried out in bath 22 with deionized water. After the wafer 12 is thoroughly rinsed, it is dried in a drying tank 24 such as a Maragoni tank that utilizes isopropyl alcohol vapor for drying.

The present invention novel method for plasma etching a wafer after a backside grinding process which incorporates an oxidation pretreatment step has therefore been amply described in the above description and in the appended drawings of FIGS. 2 and 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for plasma etching a wafer after backside grinding incorporating an oxidation pre-treatment step comprising the steps of:

grinding a backside of a wafer exposing a bare silicon surface;

oxidizing said bare silicon surface forming a silicon oxide layer of at least 50 Å thick in an oxidation chamber;

positioning said wafer in a plasma etch chamber with an active surface of the wafer exposed; and plasma etching away a surface, layer from said active surface of the wafer.

2. A method for plasma etching a wafer after backside grinding incorporating an oxidation pretreatment stop according to claim 1 further comprising the step of wet stripping a residual surface layer away from said active surface of the wafer.

3. A method for plasma etching a wafer after backside grinding incorporating an oxidation pretreatment step according to claim 1 further comprising the step of wet stripping a residual surface layer away by exposing said active surface of the wafer to a diluted acid solution.

4. A method for plasma etching a wafer after backside grinding incorporating an oxidation pretreatment step according to claim 1 further comprising the step of grinding said backside of the water in a backside lapping process.

5. A method for plasma etching a wafer after backside grinding incorporating an oxidation pretreatment stop according to claim 1 further comprising the step of oxidizing said bare silicon surface in an oxidation furnace.

6. A method for plasma etching a wafer after backside grinding incorporating an oxidation pretreatment step according to claim 1 further comprising the step of oxidizing said bare silicon surface in an oxidation furnace for a time period between about 30 min. and about 100 min.

7. A method for plasma etching a wafer after backside grinding incorporating an oxidation pretreatment step according to claim 1 further comprising the step of plasma etching away a surface layer by exposing said wafer to an oxygen plasma.

8. A method for plasma etching a wafer after backside grinding incorporating an oxidation pretreatment step according to claim 1 further comprising the step of plasma etching away a photoresist coating layer by oxygen plasma in a plasma ashing process.

9. A method for plasma etching a wafer after backside grinding incorporating an oxidation pretreatment step according to claim 1 further comprising the step of:

plasma etching away a photoresist coating layer by oxygen plasma; and wet stripping any residual photoresist coating layer from said wafer.

10. A method for plasma etching a wafer after backside grinding incorporating an oxidation pretreatment step according to claim 1 further comprising the step of plasma etching away an organic material layer by oxygen plasma in a plasma etching process.

11. A method for preventing wafer backside non-uniform oxidation during a plasma ashing process for removing a photoresist layer comprising the steps of:

grinding a backside of a wafer exposing a bare silicon surface;

oxidizing said bare silicon surface forming a silicon oxide layer of at least 50 Å thick in an oxidation chamber;

positioning said wafer in a plasma etch chamber with an active surface of the wafer exposed;

plasma etching away said photoresist layer on said active surface of the water; and wet stripping away any residual photoresist layer by a wet bench process.

12. A method for preventing wafer backside non-uniform oxidation during a plasma ashing process for removing a photoresist layer according to claim 11 further comprising the step of stripping said residual photoresist layer away by a wet bench process that utilizes a diluted acid stripper.

13. A method for preventing wafer backside non-uniform oxidation during a plasma ashing process for removing a photoresist layer according to claim 11 further comprising the step of oxidizing said bare silicon surface until a $SiO_2$ layer having a thickness between about 50 Å and about 200 Å is formed.

14. A method for preventing wafer backside non-uniform oxidation during a plasma ashing process for removing a photoresist layer according to claim 11 further comprising the step of oxidizing said bare silicon surface for a time period between about 30 min. and about 100 min.

15. A method for preventing wafer backside non-uniform oxidation during a plasma ashing process for removing a photoresist layer according to claim 11 further comprising the step of plasma etching away said photoresist layer by an oxygen plasma.

16. A method for preventing wafer backside non-uniform oxidation during a plasma ashing process for removing a photoresist layer according to claim 11 further comprising the step of plasma etching away a photoresist layer formed of a polymeric material.

17. A method for preventing wafer backside non-uniform oxidation during a plasma ashing process for removing a photoresist layer according to claim 11 further comprising the step of plasma etching away a photoresist layer formed of an organic material.

18. A method for preventing wafer backside non-uniform oxidation during a plasma ashing process for removing a photoresist layer according to claim 11 further comprising the step of plasma etching away a photoresist layer formed of polyimide.

19. A method for preventing wafer backside non-uniform oxidation during a plasma ashing process for removing a photoresist layer according to claim 11 further comprising the step of plasma etching away a photoresist layer at an etch rate of at least 50K Å/min.

20. A method for preventing wafer backside non-uniform oxidation during a plasma ashing process for removing photoresist layer according to claim 11 further comprising the step of plasma etching away a photoresist layer for a time period of at least 30 sec. at an etch rate of at least 50K Å/min.

* * * * *